United States Patent [19]
Shinada et al.

[11] Patent Number: 5,932,351
[45] Date of Patent: Aug. 3, 1999

[54] HEAT RESISTANT RESIN COMPOSITION AND ADHESIVE SHEET USING THE SAME

[75] Inventors: Eiichi Shinada, Ibaraki-ken; Yoshiyuki Tsuru, Shimodate; Takeshi Horiuchi, Tochigi-ken, all of Japan

[73] Assignee: Hitachi Chemical Company, Ltd., Tokyo, Japan

[21] Appl. No.: 08/940,009

[22] Filed: Sep. 29, 1997

[30] Foreign Application Priority Data

Oct. 31, 1996 [JP] Japan ................................. 8-289402
Mar. 18, 1997 [JP] Japan ................................. 9-064013

[51] Int. Cl.$^6$ ........................... B32B 27/38; C08F 283/04
[52] U.S. Cl. ................... 428/413; 428/423.1; 525/423; 525/438; 525/452; 525/528
[58] Field of Search .................. 428/413, 423.1; 525/423, 438, 452, 528

[56] References Cited

U.S. PATENT DOCUMENTS

| | | | |
|---|---|---|---|
| 4,316,974 | 2/1982 | Ohmura et al. | 525/452 |
| 5,387,652 | 2/1995 | Kawaki et al. | 525/452 |
| 5,750,257 | 5/1998 | Doshita et al. | 428/379 |

FOREIGN PATENT DOCUMENTS

| | | |
|---|---|---|
| 0013767 | 8/1980 | European Pat. Off. . |
| 2441020 | 3/1976 | Germany . |
| 4-039323 | 2/1992 | Japan . |
| 5-339523 | 12/1993 | Japan . |

OTHER PUBLICATIONS

Encyclopedia of Science and Technology, vol. 6, pp. 350–351, 1986.
English Abstract of Japanese Patent Document No. 05–179220 (Jul. 1993).
English Abstract of Japanese Patent Document No. 62–151458 (Jul. 1987).
English Abstract of Japanese Patent Document No. 04–042521 (Feb. 1992).

*Primary Examiner*—Randy Gulakowski
*Attorney, Agent, or Firm*—Antonelli, Terry, Stout & Kraus, LLP

[57] ABSTRACT

A heat resistant resin composition comprising (a) a polyamide-imide resin and (b) a thermosetting resin component, said composition giving a cured product having a storage elastic modulus at 300° C. of 30 MPa or more, provides an adhesive sheet showing excellent solder heat resistance.

13 Claims, 1 Drawing Sheet

AFTER SOLDER FLOAT

AFTER SOLDER FLOAT

HEAT RESISTANT RESIN COMPOSITION AND ADHESIVE SHEET USING THE SAME

BACKGROUND OF THE INVENTION

The present invention relates to a heat resistant resin composition and an adhesive sheet made thereof.

Polyamide-imide resins are utilized in various fields because of their excellent electrical and mechanical properties and high heat resistance.

However, in use of a polyamide-imide resin film as an interlaminar adhesive film for wiring boards, the film is required to be able to withstand heat of the solder bath which may exceed 260° C., but conventional polyamide-imide resin films had a problem that they tend to form air cells in the texture or are subject to peeling in preparation or use.

SUMMARY OF THE INVENTION

The present invention provides a heat resistant resin composition which is strikingly high in heat resistance and has solved the aboved-mentioned problem, and an adhesive sheet obtained from such a resin composition.

The present invention provides a heat resistant resin composition comprising (a) a polyamide-imide resin and (b) a thermosetting resin component, said composition giving a cured product having a storage elastic modulus at 300° C. of 30 MPa or more.

DESCRIPTION OF THE PREFERRED EMBODIMENTS

Figure 1A:
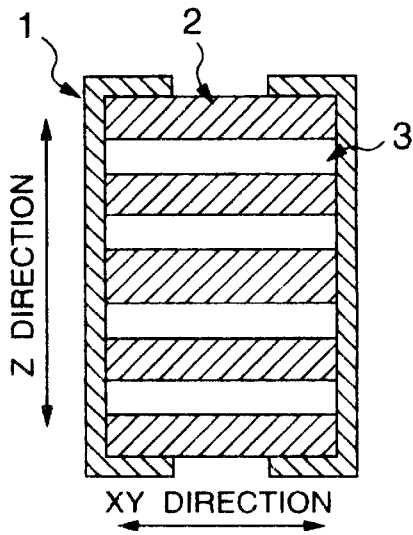
FIGS. 1A and 1B are schematic sectional drawings illustrating the change that takes place in a laminate comprising prepreg layers and adhesive layers after solder float in case the through-hole interval is narrow in the prior art.

The heat resistant resin composition of the present invention comprises (a) a polyamide-imide resin and (b) a thermosetting resin component, said composition giving a cured product having a storage elastic modulus at 300° C. of 30 MPa or more.

As the polyamide-imide resin (a), there can be used aromatic polyamide-imide resins which can be obtained by reacting an aromatic diimidodicarboxylic acid represented by the formula (1) with an aromatic diisocyanate represented by the formula (2), said aromatic diimidodicarboxylic acid of the formula (1) being obtainable by reacting a diamine having 3 or more aromatic rings with trimellitic acid anhydride. It is recommended to use an aromatic polyamide-imide resin obtained by reacting 2,2-bis[4- {4-(5-hydroxycarbonyl-1,3-dioneisoindolino) phenoxy} phenyl] propane as aromatic diimidocarboxylic acid with 4,4'-diphenylmethane diisocyanate as aromatic diisocyanate.

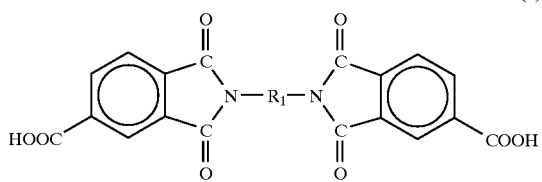

wherein $R_1$ is

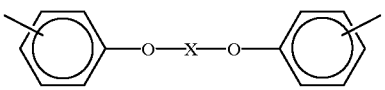

and, X is

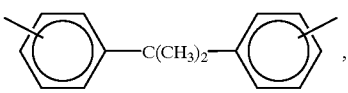

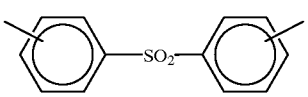

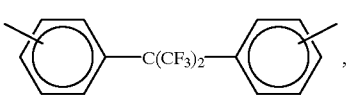

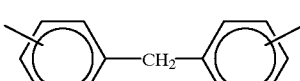

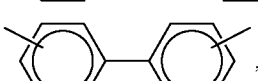

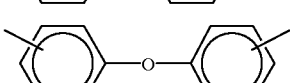

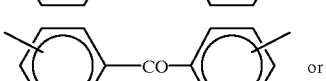 or

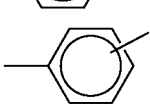

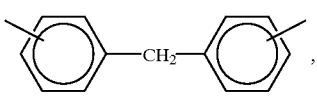

wherein $R_2$ is

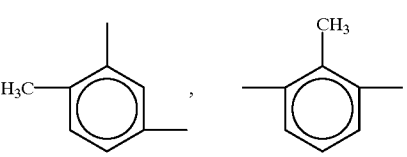

-continued

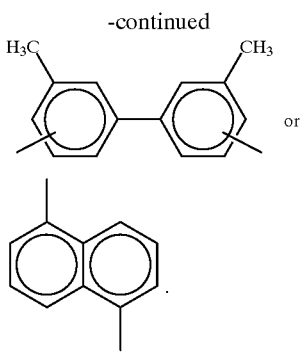

or

Examples of the diamines having 3 or more aromatic rings usable in this invention include 2,2-bis[(4-aminophenoxy)phenyl]propane, bis[4-(3-aminophenoxy)phenyl]sulfone, bis[4-(4-aminophenoxy)phenyl]sulfone, 2,2-bis[4-(4-aminophenoxy)phenyl]hexafluoropropane, bis[4-(4-aminophenoxy)phenyl]methane, 4,4-bis(4-aminophenoxy)biphenyl, bis[4-(4-aminophenoxy)phenyl] ether, bis[4-(4-aminophenoxy)phenyl]ketone, 1,3-bis(4-aminophenoxy)benzene, and 1,4-bis(4-aminophenoxy) benzene. These diamines may be used singly or as a mixture thereof.

Examples of the aromatic diisocyanates usable in this invention include 4,4'-diphenylmethane diisocyanate, 2,4-tolylene diisocyanate, 2,6-tolylene diisocyante, naphthalene-1,5-diisocyanate, and 2,4-tolylene dimers, which may be used singly or in combination.

As the thermosetting resin component, the epoxy resins having 2 or more glycidyl groups and their curing agents and the epoxy resins having 2 or more glycidyl groups and their curing accelerators are preferably used. The greater the number of the glycidyl groups, the better. Preferably the number of the glycidyl groups is 3 or more. The amount of the thermosetting resin component to be used varies depending on the number of the glycidyl groups. Specifically, the greater the number of the glycidyl groups is, the less may be the amount of the thermosetting resin component which needs to be used for bettering storage elastic modulus at 300° C.. It is more preferable to use both a curing agent and a curing accelerator for the epoxy resin.

The epoxy resins usable in this invention include bisphenol A epoxy resins (e.g. YD8125, a trade name, mfd. by Toto Kasei K. K.) and cresol novolak epoxy resins (e.g. ESCN 195, a trade name, mfd. by Sumitomo Chemical Co., Ltd., and EOCN 1020, a trade name, mfd. by Nippon Kayaku Co., Ltd.).

The epoxy resin curing agent or curing accelerator may be of any type as far as it is capable of reacting with the epoxy resin used or accelerating its curing. For example, amines, imidazoles, polyfunctional phenols and acid anhydrides can be used as such a curing agent or curing accelerator.

The amines usable for said purpose include dicyandiamide, diaminodiphenylmethane and guanylurea. The imidazoles include alkyl-substituted imidazoles and benzimidazole. The polyfunctional phenols include hydroquinone, resorcinol, bisphenol A and their halides, novolaks which are the condensates with aldehyde, and resol resins. The acid anhydrides include phthalic anhydride, hexahydrophthalic anhydride and benzophenonetetracarboxylic acid. Polyfunctional phenols are preferred as curing agent, and imidazoles are recommendable as curing accelerator.

The novolak and cresol resins usable in this invention include phenolic novolak resins (e.g. H400, a trade name, mfd. by Meiwa Plastic Industries, Ltd.), bisphenol A novolak resins (e.g. VH 4170, a trade name, mfd. by Dainippon Ink and Chemicals, Inc.) and cresol novolak resins (e.g. KA 1160, a trade name, mfd. by Dainippon Ink and Chemicals, Inc.).

The curing agent or curing accelerator is used, in the case of amines, preferably in such an amount that the active hydrogen equivalent of the amine will become substantially equal to the epoxy equivalent of the epoxy group of the epoxy resin. In case of using an imidazole, its amount can not be simply expressed by an active hydrogen equivalent, but it is empirically preferred that its amount be 1–10 parts by weight per 100 parts by weight of the epoxy resin. In the case of a polyfunctional phenol or an acid anhydride, its amount is preferably 0.6–1.2 equivalents per equivalent of the epoxy resin.

If the amount of the curing agent or curing accelerator is too small, an uncured epoxy resin may be left to reduce the storage elastic modulus at 300° C. of the cured product, while too much amount of the curing agent or curing accelerator will result in retaining unreacted curing agent or curing accelerator to reduce insulating properties.

It is possible to enhance plating adhesiveness on the walls of the through-holes in use of the composition for wiring boards, or to incorporate a catalyst for electroless plating for producing wiring boards according to an additive method.

In the present invention, these components are mixed in an organic solvent to form a heat resistant resin composition. Any organic solvent capable of dissolving the components can be used, the examples of such solvent including dimethylacetamide, dimethylformamide, dimethyl sulfoxide, N-methyl-2-pyrrolidone, γ-butyrolactone, sulfolane, cyclohexanone and the like.

In practical use of this heat resistant resin composition, it may be coated on a releasing PET film to make an adhesive sheet or may be coated on one side of a metal foil to make an adhesive sheet having a metal foil. After coating, the composition may be dried with heating into a cured state as desired.

In order to make the storage elastic modulus at 300° C. of the cured product of said heat resistant resin composition 30 MPa or higher, the mixing ratios of the components need to be varied depending on the number of the glycidyl groups of the epoxy resin in the thermosetting resin component. When the number of the glycidyl groups is 3 or more, the ratio of the thermosetting resin component is preferably 10–150 parts by weight per 100 parts by weight of the polyamide-imide resin. When the ratio of the thermosetting resin component is less than 10 parts by weight, the storage elastic modulus at 300° C. of the cured product is low, and when the ratio exceeds 150 parts by weight, compatibility of the thermosetting resin component with the resin composition lowers to cause gelation when stirred or reduction of flexibility of the produced film. When the number of the glycidyl groups is 2, the ratio of the thermosetting resin component is preferably 40–150 parts by weight per 100 parts by weight of the polyamide-imide resin. If the ratio of the thermosetting resin component is less than 40 parts by weight, the storage elastic modulus at 300° C. of the cured product will be low, and if the ratio of the thermosetting resin component exceeds 150 parts by weight, compatibility of the thermosetting resin component with the resin composition lowers to cause gelation when stirred or a reduction of flexibility of the produced film. An epoxy resin having 2 glycidyl groups and an epoxy resin having 3 or more glycidyl groups may coexist as a mixture. In this case, the lower limit of the mixing ratio varies between 10 and 40 parts by weight, but it should be selected so that the storage elastic modulus at 300° C. of the cured product will become 30 MPa or higher.

Figure 1B:
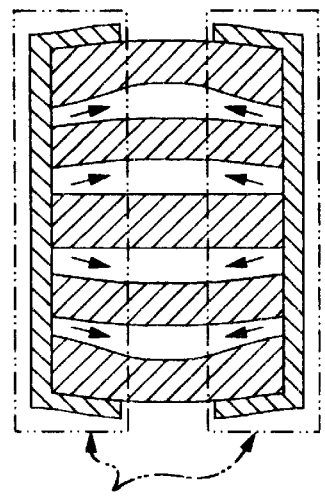

Regarding formation of air cells (or bubbles) and film peeling that are seen in the conventional polyamide-imide resin films, it was found as a result of observation of these phenomena that they tend to occur in the portion of the film where the interval of through-holes is wide while they are suppressed in the portion where the through-hole interval is narrow. This fact is explained more in detail below referring to FIGS. 1A and 1B.

In case the through-hole interval is narrow, the resin layer is unable to expand in the X-Y directions since both ends of the resin layer (comprising prepreg layers 2 and adhesive layers 3) are fixed by through-hole copper 1. Therefore, the resin layer is urged to expand in the Z directions, but since both ends of the layer are also fixed by through-hole pads, the polyamide-imide resin used for the adhesive layer 3 is caused to flow to the central area where the resin is allowed to expand more easily since the polyamide-imide resin is thermoplastic and becomes easier to flow when heated, with the result that the adhesive layer is thinned at the portions close to the through-holes while thickened at the central portion. However, since the through-hole interval is narrow, pressure is exerted to the entirety of the resin layer to elevate the internal pressure, suppressing the resin flow in the adhesive layer (see the portions enclosed with rectangles indicated by two solid line arrows in FIG. 1B).

Figure 2A:
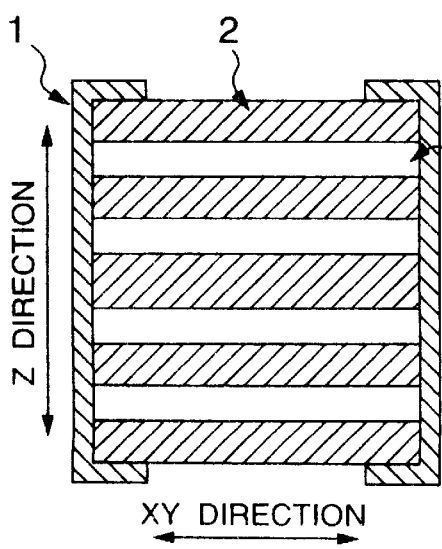
FIGS. 2A and 2B are schematic sectional drawings illustrating the change that takes place in a laminate comprising prepreg layers and adhesive layers after solder float in case the through-hole interval is wide in the prior art.
Figure 2B:
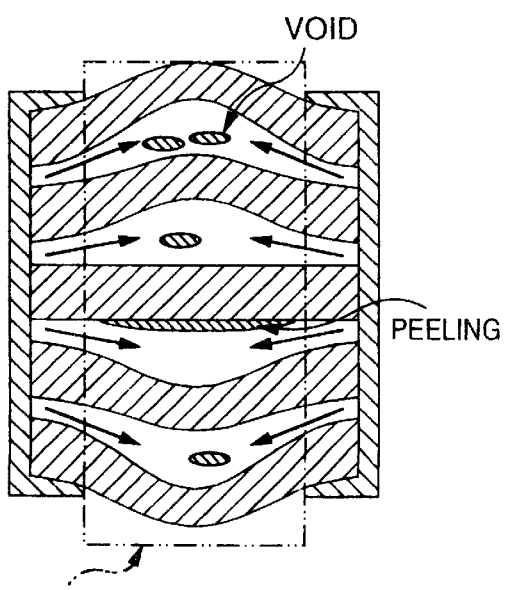

In contrast, in case the through-hole interval is wide as shown in FIGS. 2A and 2B, since the interval of the through-hole pads is wide after solder float, the pressure exerted to the resin layer becomes less than at the portion where the through-hole pad interval is narrow, encouraging flow of the resin in the adhesive layer and its expansion in the Z directions. Consequently, the pressure exerted to the inside of the resin layer is released to promote the resin flow, elevating the risk of formation of voids and peeling of the film (see the portions enclosed with rectangles indicated by a solid line arrow in the middle section of FIG. 2B).

Usually, in a wiring board, there exist intermingledly both the portions where the through-hole interval is wide and the portions where said interval is narrow, so that when a problem arises in either of these two portions, the board becomes inoperative.

Examining the post-curing properties of the polyamide-imide resin films, it was found that these films after curing are greatly reduced in storage elastic modulus at 300° C., and this is considered the cause of reduction of heat resistance, viz. enhancement of resin flow.

In an experiment for determining what degree of storage elastic modulus is necessary for providing desired heat resistance to the produced wiring board, it was found that a storage elastic modulus at 300° C. of 30 MPa or higher (up to about 1000 MPa) is needed to give desired heat resistance. It was also found that a more preferable result can be expected when the coefficient of linear expansion at temperatures between the glass transition point (Tg) and 350° C. is 500 ppm/°C or lower.

As described above, the heat resistant resin composition according to the present invention can remarkably improve the storage elastic modulus at 300° C. of its cured product by effecting three-dimensional crosslinkage of the whole resin by using a polyamide-imide resin (a) and as a thermosetting resin component (b) an epoxy resin and its curing agent, or by incorporating the epoxy resin in the polyamide-imide resin by using an epoxy resin curing accelerator in place of a curing agent.

This heat resistant resin composition may be coated on a releasing PET film or the like to obtain an adhesive sheet, or may be applied on one side of a metal foil to make a metal-foiled adhesive sheet. Such an adhesive sheet can be used, for instance, as an interlaminar adhesive film for wiring boards. In such uses, because of high storage elastic modulus at 300° C., fluidity of the resin when heated is reduced to improve heat resistance of the film. Also, since the resin composition of the present invention shows a high glass transition point even when cured at a low temperature below 200° C., the sheet made therefrom has excellent dimensional stability.

The present invention is further illustrated by the following examples.

PRODUCTION EXAMPLE 1

123.2 g (0.3 mol) of 2,2-bis-[4-(4-aminophenoxy) phenyl] propane as a diamine having 3 or more aromatic rings, 115.3 g (0.6 mol) of trimellitic acid anhydride and 716 g of NMP (N-methyl-2-pyrrolidone) as solvent were supplied into a one-liter separable flask provided with a cocked 25 ml water measuring receiver connected to a reflux condenser, a thermometer and a stirrer, and stirred at 80° C. for 30 minutes.

Then 143 g of toluene was supplied as an aromatic hydrocarbon capable of forming an azeotrope with water, and the mixture was heated to around 160° C. and refluxed for 2 hours.

After confirming that water was stored in an amount of approximately 10.8 ml or more in the water measuring receiver, and that there was no longer observed evaporation of water, the distillate stored in the water measuring receiver was removed and the temperature was raised to about 190° C. to remove toluene.

Thereafter, the solution was cooled to room temperature, and 75.1 g (0.3 mol) of 4,4'-diphenylmethane diisocyanate was supplied as an aromatic diisocyante to carry out the reaction at 190° C. for 2 hours. This reaction gave an NMP solution of an aromatic polyamide-imide resin.

EXAMPLES 1–10

To 100 parts by weight of the polyamide-imide resin obtained in Production Example 1, various types of epoxy resins, phenol resins and curing accelerators were mixed in the ratios shown in Table 1 and stirred for about one hour until the resin mixtures became homogeneous to prepare the resin compositions.

Each of the thus prepared resin compositions was coated on a releasing film to a dry coating thickness of about 50 μm and dried at 120° C. for 20 minutes.

The coated film was fixed on a Teflon frame and dried at 180° C. for 60 minutes to obtain a film as cured product, and its properties were determined.

As a result, it was found that the cured product was remarkably improved in linear expansion coefficient (not greater than 500 ppm/°C) as compared with the single body of polyamide-imide resin, and the storage elastic modulus at 300° C. of the cured product was 30 MPa or above, indicating high heat resistance of the cured product.

COMPARATIVE EXAMPLE 1

The properties of the cured product (film) of the polyamide-imide resin obtained in Production Example 1 were evaluated. The results showed that the obtained film, although high in Tg, was small in storage elastic modulus at 300° C., and was also low in heat resistance due to large linear expansion coefficient.

COMPARATIVE EXAMPLES 2–9

To 100 parts by weight of the polyamide-imide resin obtained in Production Example 1, various types of epoxy resins and phenol resins or curing accelerators were mixed in the ratios shown in Table 1 and stirred for about one hour until the resin mixtures became homogeneous to obtain the resin compositions. Each of these resin compositions was coated on a releasing film to a dry coating thickness of about 50 μm and dried at 120° C. for 20 minutes. Thereafter, the coated film was fixed on a Teflon frame and dried at 180° C.

for 60 minutes to obtain a cured product film, and its properties were examined.

In Comparative Examples 3 and 4 where the thermosetting resin component was contained in an amount greater than 150 parts by weight per 100 parts by weight of the polyamide-imide resin, the composition gelled when stirred and was incapable of forming a film. In other Comparative Examples, the thermosetting resin component was less than 40 parts by weight in the compositions using an epoxy resin having 2 glycidyl groups (Comparative Examples 2, 6 and 7) and the thermosetting resin component was less than 10 parts by weight in the compositions using an epoxy resin having 3 or more glycidyl groups (Comparative Examples 5, 8 and 9), and the storage elastic modulus at 300° C. of the cured products of these compositions was less than 30 MPa, so that the films made of these compositions were low in heat resistance.

The measured values shown in the Examples and Comparative Examples were determined by the following methods.

(1) Glass transition point (Tg)

This was determined by using TMA (a trade name, mfd. by Mac Science Inc.) under the following conditions:

Jig: pulling

Chuck interval: 15 mm

Measuring temperature: room temperature (25° C.)~350° C.

Heating rate: 10° C./min

Tensile load: 5 g

Sample size: 5 mm×30 mm (2) Linear expansion coefficient

This was also determined by using TMA (a trade name, mfd. by Mac Science Inc.) under the following conditions:

Jig: pulling

Chuck interval: 15 mm

Measuring temperature: room temperature (25° C.)~350° C.

Heating rate: 10° C./min

Tensile load: 5 g

Sample size: 5 mm×30 mm (3) Storage elastic modulus

This was determined by using DVE-V4 (a trade name, mfd. by RHEOLOGY CO., LTD.) under the following conditions:

Jig: pulling

Chuck interval: 20 mm

Measuring temperature: room temperature (25° C.)~350° C.

Measuring frequency: 10 Hz

Heating rate: 5° C./min

Sample size: 5 mm×30 mm

TABLE 1

| | Thermosetting component | | | Composition (weight ratio) | | | | | Mechanical properties | | |
|---|---|---|---|---|---|---|---|---|---|---|---|
| | EP | PH | ACC | PAI | EP | PH | ACC | EP + PH + ACC | Tg (° C.) | α (ppm/° C.) | DVE |
| Example 1 | YD8125 | H400 | — | 100 | 38.6 | 23.1 | — | 61.70 | 217 | 195 | 43 |
| Example 2 | ESCN195 | H400 | — | 100 | 21.3 | 11.6 | — | 32.90 | 241 | 170 | 103 |
| Example 3 | ESCN195 | H400 | — | 100 | 42.5 | 23.1 | — | 65.60 | 207 | 130 | 179 |
| Example 4 | EOCN1020 | H400 | — | 100 | 43.5 | 23.0 | — | 66.40 | 223 | 131 | 168 |
| Example 5 | ESCN195 | — | 2E4MZ | 100 | 42.5 | — | 0.43 | 42.93 | 265 | 170 | 84.4 |
| Example 6 | EOCN1020 | — | 2E4MZ | 100 | 43.5 | — | 0.44 | 43.93 | 265 | 159 | 99 |
| Example 7 | ESCN195 | VH4170 | — | 100 | 59.5 | 24.6 | — | 75.10 | 210 | 150 | 120 |
| Example 8 | EOCN1020 | VH4170 | — | 100 | 42.3 | 24.8 | — | 77.10 | 215 | 140 | 145 |
| Example 9 | EOCN1020 | KA1160 | — | 100 | 45.3 | 21.5 | — | 66.80 | 223 | 125 | 103 |
| Example 10 | ESCN195 | KA1160 | — | 100 | 43.6 | 21.2 | — | 64.80 | 218 | 140 | 98 |
| Comp. Example 1 | — | — | — | 100 | — | — | — | 0.00 | 229 | 6400 | 5.2 |
| Comp. Example 2 | YD8125 | H400 | — | 100 | 19.3 | 11.6 | — | 30.90 | 255 | 270 | 18.8 |
| Comp. Example 3 | YD8125 | H400 | — | 100 | 97.5 | 58.0 | — | 155.50 | Incapable of forming a film | | |
| Comp. Example 4 | ESCN195 | H400 | — | 100 | 101.3 | 54.8 | — | 156.10 | Incapable of forming a film | | |
| Comp. Example 5 | EOCN1020 | H400 | — | 100 | 6.3 | 3.3 | — | 9.60 | 250 | 450 | 21.5 |
| Comp. Example 6 | YD8125 | — | 2E4MZ | 100 | 8.4 | — | 0.88 | 8.48 | 248 | 1370 | 6.3 |
| Comp. Example 7 | YD8125 | — | 2E4MZ | 100 | 25.5 | — | 0.26 | 25.76 | 254 | 940 | 7.6 |
| Comp. Example 8 | ESCN195 | — | 2E4MZ | 100 | 9.6 | — | 0.10 | 9.70 | 262 | 306 | 18.7 |
| Comp. Example 9 | EOCN1020 | — | 2E4MZ | 100 | 8.9 | — | 0.09 | 8.99 | 262 | 244 | 29.3 |

1) EP: epoxy resin; PH: phenol resin; ACC: curing accelerator; PAI: polyamide-imide, α: linear expansion coefficient; DVE: storage elastic modulus
2) Trade names used in this Table
YD8125: bisphenol A epoxy resin (mfd. by Toto Kasei K.K.)
ESCN195: cresol novolak epoxy resin (mfd. by Sumitomo Chemical Co., Ltd.)
EOCN1020: cresol novolak epoxy resin (mfd. by Nippon Kayaku Co., Ltd.)
H400: phenolic novolak resin (mfd. Meiwa Plastic Industries, Ltd.)
VH4270: bisphenol A novolak resin (mfd. by Dainippon Ink and Chemicals, Inc.)
KA1160: cresol novolak phenol resin (mfd. by Dainippon Ink and Chemicals, Inc.)

As explained above, it is quite remarkable that the storage elastic modulus at 300° C. of the cured product of the heat resistant resin composition according to the present invention is as high as 30 MPa or above, and this heat resistant resin composition can be worked into a sheet for various uses such as an interlaminar adhesive film for wiring boards. Thus, the present invention provides a heat resistant resin composition which shows such high heat resistance as could never be obtained in the prior art, and an adhesive sheet made of such a composition.

The present resin composition also shows a high glass transition point even when cured at a low temperature below 200° C., which corroborates excellent dimensional stability of the cured products of said resin composition.

As described above, there are provided according to the present invention a heat resistant resin composition whose heat resistance is unprecedentedly high, and an adhesive sheet made by using such a composition.

What is claimed is:

1. A heat resistant resin composition comprising (a) a polyamide-imide resin and (b) a thermosetting resin component, said composition giving a cured product having a storage elastic modulus at 300° C. of 30 MPa or more, wherein the polyamide-imide resin is an aromatic polyamide-imide resin obtained by reacting an aromatic diimidodicarboxylic acid represented by the formula (1) with an aromatic diisocyanate represented by the formula (2), said aromatic diimidodicarboxylic acid of the formula (1) being obtained by reacting a diamine having 3 or more aromatic rings with trimellitic acid anhydride:

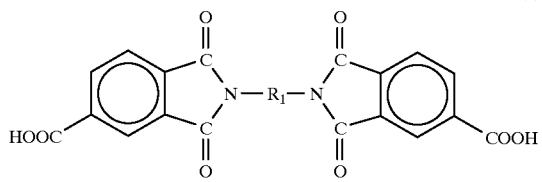
(1)

wherein $R_1$ is

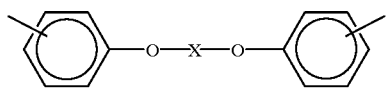

and, X is

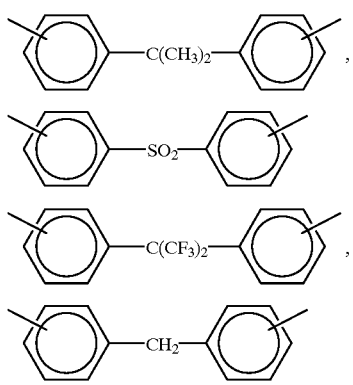

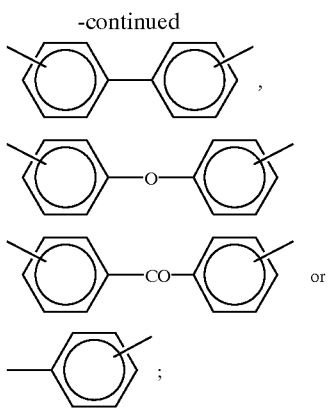

$$OCN-R_2-NCO \qquad (2)$$

wherein $R_2$ is

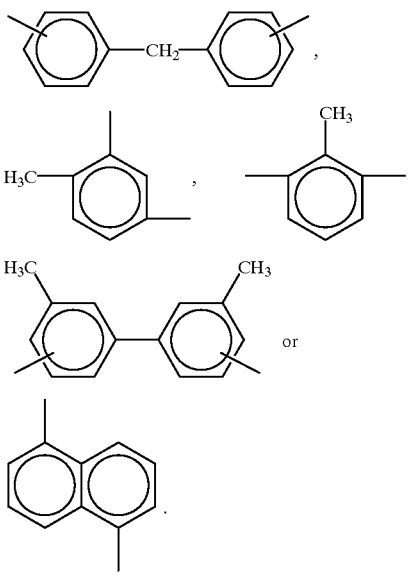

and wherein the thermosetting resin component comprises an epoxy resin having 2 or more glycidyl groups.

2. A heat resistant resin composition according to claim 1, wherein the polyamide-imide resin is an aromatic polyamide-imide resin obtained by reacting 2,2-bis[4-{4-(5-hydroxycarbonyl-1,3-dioneisoindolino) phenoxy}phenyl] propane as an aromatic diimidodicarboxylic acid with 4,4'-diphenylmethane diisocyante as an aromatic diisocyante.

3. A heat resistant resin composition according to claim 1, wherein the thermosetting resin component further comprises a curing agent for the epoxy resin.

4. A heat resistant resin composition according to claim 3, wherein the curing agent is a phenol resin having hydroxyl groups.

5. A heat resistant resin composition according to claim 1, wherein the thermosetting resin component further comprises a curing accelerator for the epoxy resin.

6. A heat resistant resin composition according to claim 5, wherein the curing accelerator is an alkyl-substituted imidazole.

7. A heat resistant resin composition according to claim 1, wherein the thermosetting resin component further comprises a curing agent accelerator for the epoxy resin and a curing accelerator for the epoxy resin.

8. A heat resistant resin composition according to claim 7, wherein the curing agent or curing accelerator is selected from the group consisting of dicyanodiamide, diaminodiphenylmethane, guanylurea, alkyl substituted imidazole, benzimidazole, hydroquinone, resorcinol, bisphenol A, novolak resin, phthalic anhydride, hexahydrophthalic anhydride and benzophenonetetracarboxylic acid.

9. A heat resistant resin composition according to claim 1, wherein the thermosetting resin component including an epoxy resin having 2 glycidyl groups is used in an amount of 40–150 parts by weight per 100 parts by weight of the polyamide-imide resin.

10. A heat resistant resin composition according to claim 1, wherein the thermosetting resin component including an epoxy resin having 3 or more glycidyl groups is used in an amount of 10–150 parts by weight per 100 parts by weight of the polyamide-imide resin.

11. An adhesive sheet obtained by coating a varnish of the heat resistant resin composition of claim 1 on a substrate, followed by drying.

12. A heat resistant resin composition according to claim 1, wherein the epoxy resin is a bisphenol A epoxy resin and cresol novolak.

13. A heat resistant resin composition according to claim 1, wherein said composition further comprises an organic solvent selected from the group consisting of dimethylacetamide, dimethylformamide, dimethylsulfoxide, N-methyl-2-pyrrolidone, gamma-butyrolactone, sulfolane and cyclohexanone.

* * * * *